United States Patent [19]
Truong et al.

[11] Patent Number: 6,031,982
[45] Date of Patent: Feb. 29, 2000

[54] LAYOUT DESIGN OF INTEGRATED CIRCUIT, ESPECIALLY DATAPATH CIRCUITRY, USING FUNCTION CELLS FORMED WITH FIXED BASIC CELL AND CONFIGURABLE INTERCONNECT NETWORKS

[75] Inventors: Ho D. Truong, San Jose; DongWon Park, Santa Clara; Hyungsuk Yang, Cupertino; Seokkyun Jung, San Jose, all of Calif.

[73] Assignee: Samsung Electronics Co., Ltd., Kyungki-do, Rep. of Korea

[21] Appl. No.: 08/749,861

[22] Filed: Nov. 15, 1996

[51] Int. Cl.$^7$ ............................. G06F 17/50; H01L 27/10
[52] U.S. Cl. ................................ 395/500.17; 395/500.18; 395/500.19; 326/38; 326/39; 438/129; 257/208
[58] Field of Search ..................... 364/488–491, 364/578; 257/208–210, 909; 438/128, 129; 326/38, 39; 395/500.02–500.19

[56] References Cited

U.S. PATENT DOCUMENTS

| | | | |
|---|---|---|---|
| 4,742,383 | 5/1988 | Fitzerald | 257/204 |
| 5,289,021 | 2/1994 | El Gamal | 257/206 |
| 5,345,401 | 9/1994 | Tani | 395/500.37 |
| 5,426,591 | 6/1995 | Ginetti et al. | 395/500.07 |
| 5,490,095 | 2/1996 | Shimada et al. | 395/500.35 |
| 5,510,999 | 4/1996 | Lee et al. | 395/500.06 |
| 5,547,887 | 8/1996 | Brown et al. | 438/129 |
| 5,689,432 | 11/1997 | Blaauw et al. | 395/500.19 |
| 5,694,057 | 12/1997 | Gould | 326/39 |
| 5,726,903 | 3/1998 | Kerzman et al. | 395/500.03 |
| 5,737,237 | 4/1998 | Tanaka et al. | 395/500.01 |
| 5,757,655 | 5/1998 | Shih et al. | 395/500.03 |
| 5,761,078 | 6/1998 | Fuller et al. | 395/500.17 |
| 5,764,533 | 6/1998 | DeDood | 395/500.09 |
| 5,872,027 | 2/1999 | Mizuno | 438/129 |

OTHER PUBLICATIONS

Al–Khalili et al. ("Optimization for BiCMOS circuits for high performance digital logic", Proceedings of the 34th Midwest Symposium on Circuits and Systems, IEEE, vol. 2, pp. 1021–1024, May 14, 1991).

Wilson ("Libraries are a core strategy at gec plessy, vlsi tech—ASIC libraries revamped", Electronic Engineering Times, No. 910, p. 56, Jul. 12, 1996.

Trick et al. ("LASSIE: Structure to Layout for Behavior Synthesis Tools", 26th ACM/IEEE Design Automation Conference, p. 8.1, Jan. 1989, pp. 104–109.

Trick et al, "LASSIE: Structure to Layout for Behavior Synthesis Tools," 26th ACM/IEEE Design Automation Conf., Paper 8.1, 1989, pp. 104–109.

Weste et al, Principles of CMOS VSLI Design, A Systems Perspective (2nd ed., Addison–Wesley Publishing Co.), 1985, pp. 21–39.

Primary Examiner—Kevin J. Teska
Assistant Examiner—Phallaka Kik
Attorney, Agent, or Firm—Skjerven, Morrill, MacPherson, Franklin & Friel LLP; Ronald J. Meetin

[57] ABSTRACT

A group of function cells (e.g., 40), each created from one or more implementations of a fixed basic cell (20), are utilized in designing a layout for at least part of an integrated circuit. Each basic cell implementation contains a plurality of unconnected transistors (Q1–Q10) arranged in a transistor pattern identical to, or a mirror image of, the transistor pattern in each other basic cell implementation. Transistors of a specified polarity type in each basic cell implementation are normally of two or more different current-carrying capabilities. Each function cell has an interconnection network (42–44) for electrically interconnecting transistors in that function cell to perform a specified electronic function. The function cells typically form a cell library from which certain function cells are selected for generating the layout. The present layout technique is particularly applicable to laying out datapath circuitry (90) in an integrated circuit.

56 Claims, 5 Drawing Sheets

LAYOUT DESIGN OF INTEGRATED CIRCUIT, ESPECIALLY DATAPATH CIRCUITRY, USING FUNCTION CELLS FORMED WITH FIXED BASIC CELL AND CONFIGURABLE INTERCONNECT NETWORKS

FIELD OF USE

This invention relates to laying out integrated circuits ("ICs"), especially datapath circuitry in ICs.

BACKGROUND ART

An IC is normally created from a generally flat semiconductor chip by establishing the circuit elements that implement the circuit's function, establishing an organization for the circuit elements along one surface of the chip, generating masks that represent the organization of the circuit elements, and fabricating the IC using the masks. The process of determining the organization of the circuit elements along the chip's surface is commonly referred to as laying out the IC. The layout design can be accomplished in various ways.

In the full-custom design approach, the circuit elements and their interconnections are laid out manually. For a specific fabrication process, an IC laid out according to the full-custom approach typically achieves the highest speed and occupies the smallest chip area among today's IC layout methodologies. However, the full-custom approach is labor intensive and thus very expensive.

The layout design cost can be reduced by using various automatic or semi-automatic techniques to decrease the layout time. For example, consider an IC in which many process operations are to be repeated largely in parallel. Such an IC can be laid out as a multi-bit datapath in which each bit of the datapath is processed along a datapath slice, commonly referred to as a bitslice, that is largely repeated for each other bit. Control logic outside the datapath is used to control information processing along the datapath. Although the datapath is typically designed and laid out manually, the layout cost is reduced by implementing the control logic with a gate array using automatic place-and-route software to define the circuit interconnections.

Referring to the drawings, FIG. 1 illustrates the circuitry details for a typical circuit element 10 implemented with a complementary metal-oxide semiconductor ("CMOS") gate array. Circuit element 10 is a two-input multiplexer-latch combination consisting of transmission gates 11–14 and CMOS inverters 15–17. Dependent on the values of complementary control signal pairs S0 and $\overline{S0}$, S1 and $\overline{S1}$, and T and $\overline{T}$, either input data signal D0 or input data signal D1 is latched to produce true data output signal Q.

In a CMOS gate array, the insulated-gate field-effect transistors ("FETs") all typically have approximately the same current-carrying capability. Consequently, many of the circuit elements, such as multiplexer-latch combination 10, laid out with a CMOS gate array employ a relatively large number of FETs. In particular, each transmission gate and CMOS inverter contains two FETs, resulting in a total of 14 FETs in circuit element 10. While using a CMOS gate array to implement the control logic for the datapath reduces the layout design time, the high number of transistors increases the chip area and leads to a loss in speed. Also, gate utilization is typically well below 100%, leading to a further increase in chip area.

Due to the high chip area and low speed, CMOS gate arrays are unattractive for laying out datapath sections of ICs. However, designing the datapath manually is time consuming and expensive. Furthermore, circuit errors in a custom-designed datapath often require a large amount of layout redesign and associated expense. It would be desirable to have a methodology by which the layout for an IC, especially the datapath of an IC, can be produced at relatively low cost without incurring the speed loss and area increase associated with the CMOS gate array approach. In would also be desirable if correction of circuit design errors in such a layout methodology could be performed without requiring substantial layout redesign and attendant cost.

GENERAL DISCLOSURE OF THE INVENTION

The present invention furnishes a cell-based technique for developing a layout for at least part of an IC. The layout technique of the invention is centered around a basic cell in which a plurality of unconnected transistors are laid out in a fixed pattern. Function cells that perform specified electronic functions are created from the basic cell. In particular, each function cell is produced from one or more implementations of the basic cell by selectively designating electrical interconnections for the cell's transistors so as to perform the desired electronic function.

The function cells can be generated for specific ICs. Typically, the function cells form a cell library from which particular function cells can be selected for a specific IC. Implementations of the function cells are employed to generate the layout. When the layout is completed, the IC is fabricated from a semiconductor body according to the layout. The electrical interconnections for each function cell are incorporated into an electrical interconnection system that overlies and interconnects the implementations of the basic cell.

The present layout technique is particularly suitable for designing an IC's datapath circuitry in which information is processed in largely a single direction. For this purpose, implementations of the basic cell are placed in an array of rows and columns. Upon establishing interconnections that convert the basic cells into the function cells, each column typically forms a repeatable bitslice of the datapath.

The cell-based layout technique of the invention permits circuit design errors to be readily corrected in an IC. For example, if a relatively small circuit element needs to be added to the IC to correct a circuit design error, unused transistors in the implemented function cells can often be interconnected to form the necessary circuit elements. In addition, a small number of uncommitted basic cell implementations, arranged in one or more rows for datapath circuitry, can be incorporated into the layout. After an initial version of the layout is completed, interconnections for these basic cells can be designated to correct errors found in the initial circuit design.

Unlike a CMOS gate array in which all the transistors have approximately the same current-carrying capability, the transistors of a given polarity type (e.g., N-channel type or P-channel type) in the basic cell of the invention are preferably of at least two different current-carrying capabilities. Normally, there are more transistors of high current-carrying capability than low current-carrying capability. When the transistors are insulated-gate FETs, one or two of the weak FETs—i.e., the FETs of low current-carrying capability—can often be substituted for strong FETs in a function cell so as to eliminate the need for certain other FETs contained in an otherwise equivalent circuit element laid out with a CMOS gate array. Hence, the number of FETs is reduced, leading to lower chip area and increased speed.

By selecting function cells from a pre-established cell library, the cost of generating an IC layout according to the invention is reduced compared to manually laying out the IC. While an IC laid out according to the invention typically does not achieve the performance of an otherwise equivalent custom laid-out IC, the performance is normally quite good, especially compared to that of an otherwise equivalent IC laid out using a CMOS gate array. Taking note of the fact that a datapath can be readily laid out according to the invention, the present layout methodology provide a substantial advance over the prior art.

BRIEF DESCRIPTIONS OF THE DRAWINGS

Figure 1:
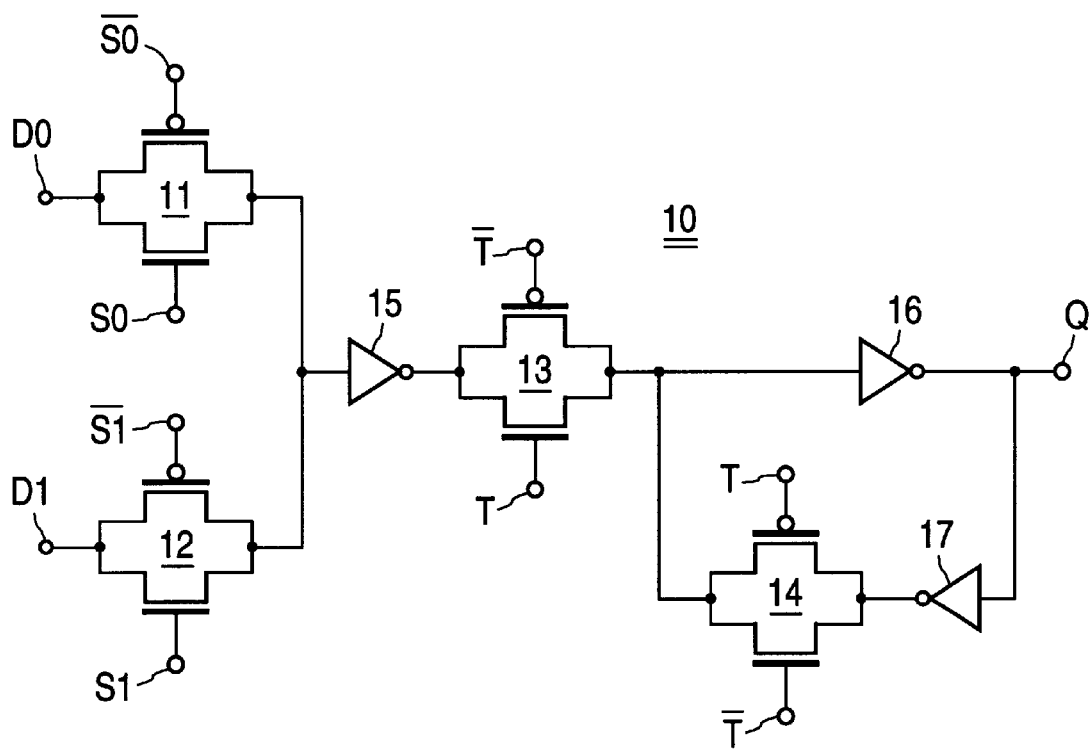
FIG. 1 is a circuit diagram of a conventional multiplexer-latch combination formed with a gate array.

Like reference symbols are employed in the drawings and in the description of the preferred embodiments to represent the same, or very similar, item or items. Source/drain regions are shown in dotted shading in FIGS. 2 and 3. Gate electrodes are indicated in slanted shading of one type in FIGS. 2 and 3. Metal lines are indicated in slanted shading of the opposite type in FIGS. 2 and 3.

DESCRIPTION OF THE PREFERRED EMBODIMENTS

Figure 2:
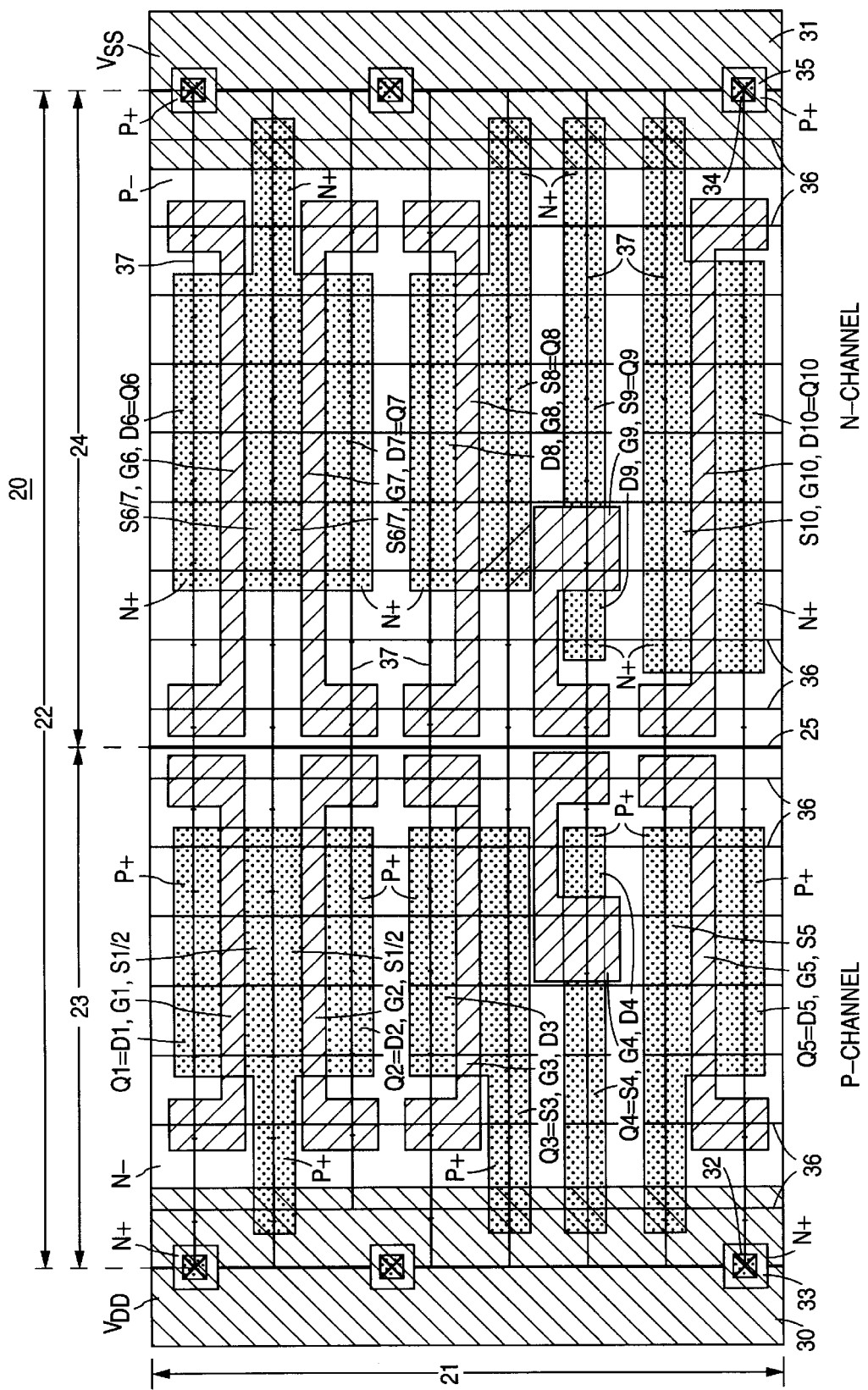
FIG. 2 is a plan view of a transistor layout of a basic cell in accordance with the invention.

Referring to FIG. 2, it illustrates a layout for a basic CMOS cell 20 suitable for use in generating function cells according to the teachings of the invention. Basic cell 20 contains ten unconnected insulated-gate enhancement-mode field-effect transistors Q1–Q10 arranged in a suitable transistor pattern. FETs Q1–Q5 are P-channel devices located in the left half of cell 20. FETs Q6–Q10 are N-channel devices located largely in the right half of cell 20.

Each FET Qi, where i is an integer running from 1 to 10, has a gate electrode Gi and a first source/drain region Di. FETs Q1 and Q2 have a common second source/drain region S1/2. Transistors Q3–Q5 respectively have second source/drain regions S3–S5. FETs Q6 and Q7 have a common second source/drain region S6/7. FETs Q8–Q10 respectively have second source/drain regions S8–S10.

The letters "S" and "D" have been used solely for convenience in the reference symbols for the first and second source/drain regions. Each source/drain region identified with a reference symbol beginning with "S" can act as the source, the drain, or switch between the source and drain during circuit operation depending on how that source/drain region is connected. The same applies to each source/drain region identified with a reference symbol beginning with "D".

P-channel FETs Q1–Q3 and Q5 are largely identical "strong" devices, each having a laid-out width-to-length ratio ("W/L") of 5–15, typically 10. P-channel FET Q4 is a "weak" device having a laid-out W/L of 0.1–0.5, typically 0.25. Consequently, each of FETs Q1–Q3 and Q5 has considerably greater current-carrying capability than FET Q4. Specifically, the current-carrying capability of each of FETs Q1–Q3 and Q5 is approximately 30–50, typically 40, times the Q4 current-carrying capability.

N-channel FETs Q6–Q8 are largely identical strong devices, each having a laid-out W/L of 10–20, typically 15. N-channel FET Q10 is an even stronger device having a laid-out W/L of 15–25, typically 20. N-channel FET Q9 is a weak device having a laid-out W/L of 0.1–0.5, typically 0.25. Each of FETs Q6–Q8 and Q10 thus has considerably greater current-carrying capability than FET Q9. Specifically, the current-carrying capability of each of FETs Q6–Q8 is approximately 40–100, typically 60, times the Q9 current-carrying capability, while the Q10-to-Q9 current-carrying capability ratio is even greater.

Basic cell 20 in FIG. 2 has a length indicated by reference symbol 21, and a width indicated by reference symbol 22. When a function cell formed with one or more implementations of basic cell 20 is fabricated from a monocrystalline silicon ("monosilicon") semiconductor wafer (body), the source/drain regions of FETs Q1–Q5 are heavily doped P-type zones formed in a lightly doped N-type well 23 of the wafer. The source/drain regions of FETs Q6–Q10 are heavily doped N-type zones formed in lightly doped P-type material 24 of the wafer. P– material 24 may be a lightly doped P-type well or a lightly doped P-type substrate that forms the bulk of the wafer. Item 25 in FIG. 2 indicates that the PN junction at the interface between N– well 23 and P– material 24.

In fabricating a function cell containing one or more implementations of basic cell 20, the gate electrodes normally consist of conductively doped polycrystalline ("polysilicon") provided on an electrically insulating layer that overlies the semiconductor wafer. Polysilicon gate electrodes G1–G5 are heavily doped P-type. Polysilicon gate electrodes G6–G10 are heavily doped N-type. An electrically insulating layer overlies gate electrodes G1–G10.

Items 30 and 31 in FIG. 2 represent metal lines provided over the semiconductor wafer at the left and right sides of basic cell 20. An electrically insulating layer separates metal lines 30 and 31 from the wafer's semiconductor material in a fabricated function cell. The insulating layer thus separates metal line 30 from the underlying parts of source/drain regions S1/2 and S3–S5. Likewise, the insulating layer separates metal line 31 from the underlying parts of source/drain regions S6/S7 and S8–S10.

In a fabricated function cell, metal line 30 extends through contact openings 32 (small squares) in the underlying insulating layer to respectively contact heavily doped N-type contact regions 33 (large squares) provided in N– well 23. Metal line 31 similarly extends through contact openings 34 (small squares) in the insulating layer to respectively contact heavily doped P-type contact regions 35 (large squares) provided in P– material 24. A high supply voltage $V_{DD}$ and a low supply voltage $V_{SS}$ are respectively applied to metal lines 30 and 31 during circuit operation. Accordingly, N– well 23 and P– material 24 are maintained respectively at supply voltages $V_{DD}$ and $V_{SS}$ during circuit operation.

In circuitry, especially datapath circuitry, laid out with functional cells created from basic cell 20, metal line 30 in one implementation of basic cell 20 can be shared with another basic cell implementation situated to the left of cell 20 in FIG. 2. Consequently, only the right half of line 30 is actually inside width 22 of cell 20. Likewise, only the right halves of contact openings 32 and N+ contact regions 33 are actually inside width 22. Since contact regions 33 are N-type, the basic cell implementation situated to the left of the illustrated cell 20 contains ten insulated-gate FETs arranged in the vertical-axis mirror image of FETs Q1–Q10 in cell 20—i.e., the mirror image oriented so that the FETs which mirror FETs Q1–Q5 are in the right half of the mirror image when FETs Q1–Q5 are in the left half of cell 20.

Metal line 31 can similarly be shared with another basic cell implementation situated to the right of basic cell 20 in FIG. 2. Accordingly, only the right halves of metal line 30, contact openings 34, and P+ contact regions 35 are actually inside width 22 of cell 20. With contact regions 35 being P-type, the basic cell implementation situated to the right of illustrated cell 20 contains ten insulated-gate FETs likewise arranged in the vertical-axis mirror image of FETs Q1–Q10.

During the fabrication of a function cell that incorporates basic cell 20, FETs Q1–Q10 are selectively electrically interconnected through an electrical interconnection system formed with a pair of patterned metal layers provided over the insulating material overlying the wafer and gate electrodes G1–G10. In the typical case, portions of the lower metal layer implement an interconnection network for selectively interconnecting FETs Q1–Q10 within basic cell 20. Portions of the lower metal layer also form metal lines 30 and 31. Portions of the upper metal layer electrically interconnect, and provide control signals to, function cells formed with basic cell 20. Portions of the two metal layers are electrically interconnected through vias provided in an electrically insulating layer that otherwise separates the two metal layers.

Sixteen imaginary thin vertical lines 36 are shown as extending along the cell length in FIG. 2. Eight imaginary thin horizontal lines 37 are similarly shown as extending along the cell width. The interconnections of vertical lines 36 and horizonal lines 37 represent pre-established locations where electrical contacts can be made between the metal lines and the underlying monosilicon or polysilicon in a fabricated function cell.

The contacts to silicon are made through contact openings etched through the insulating material at the intersections of lines 36 and 37. Since N– well 23 and P– material 24 are already connected respectively to metal lines 32 and 33, the contacts at the intersections of lines 36 and 37 are made only to the gate electrodes and source/drain regions of FETs Q1–Q10. Selective contacts between metal line 30 and the underlying parts of source/drain regions S1/S2 and S3–S5, and between metal line 31 and the underlying parts of source/drain regions S6/S7 and S8–S10, are provided for in this way.

Basic cell 20 is laid out so as to facilitate electrically interconnecting circuit elements, such as inverters, that commonly occur in function cells generated from cell 20. Due to common source/drain region S1/S2 that can be readily connected to metal line 30 to receive high supply voltage $V_{DD}$, P-channel FETs Q1 and Q2 typically form a pair of CMOS inverters respectively with N-channel FETs Q6 and Q7 having common source/drain region S6/S7 that can readily be connected to metal line 31 to receive low supply voltage $V_{SS}$. If FETs Q1 and Q6 are to form a CMOS inverter but there is no CMOS inverter to be formed from FETs Q2 and Q7, FETs Q2 and Q7 can simply be left unconnected. FET Q10, the strongest of the N-channel FETs, is located along the bottom of basic cell 20 where output signals are commonly taken so as to be well situated for use in an inverter that provides high output drive.

A library of function cells that perform specific electronic functions, such as logic, storage, and selection functions, are created from basic cell 20 by establishing patterns or networks for selectively electrically interconnecting FETs Q1–Q10 through portions of the two metal layers, typically portions of only the lower metal layer. Each function cell consists of one or more implementations of basic cell 20. In a function cell formed with two or more implementations of cell 20, part of the interconnections typically include interconnections that connect at least one FET in one basic cell implementation with at least one FET in another basic cell implementation. Also, the implementations of cell 20 in such a function cell typically adjoin one another along cell length 22—i.e., vertically in FIG. 2.

Figure 3:
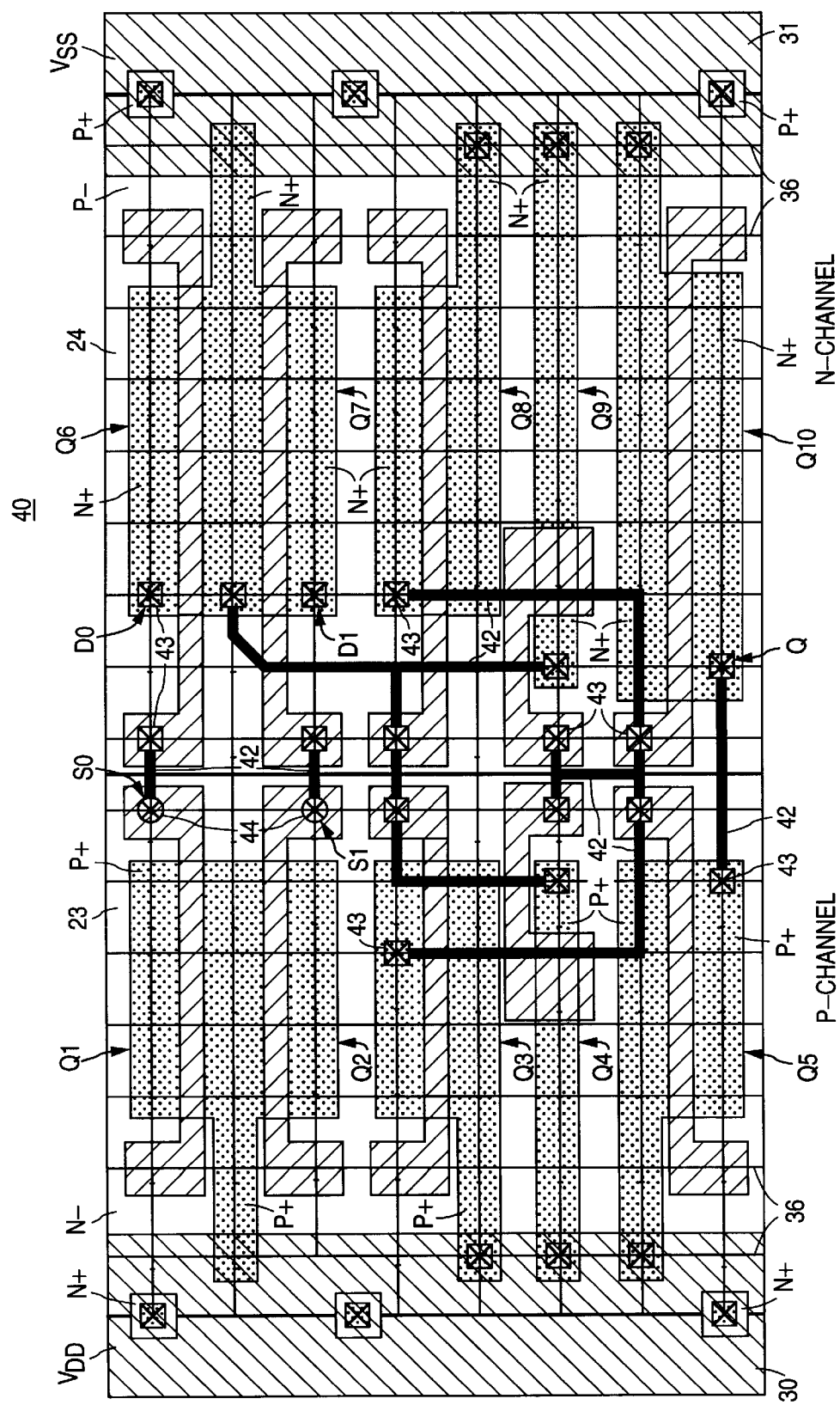
FIG. 3 is a plan view of a function cell created from the basic cell of FIG. 2 in accordance with the invention.

FIG. 3 depicts an example of how a pattern of electrical interconnections are applied to basic cell 20 to produce a layout for a function cell 40. Function cell 40 is a two-input multiplexer-latch combination whose circuit diagram is presented in FIG. 4c below. Multiplexer-latch combination 40 receives data input signals D0 and D1, selection signals S0 and S1, and provides true output signal Q.

In the exemplary layout of FIG. 3, function cell 40 utilizes FETs Q3–Q10. FETs Q1 and Q2 are left unconnected. FETs Q3 and Q8 form one strong CMOS inverter. FETs Q5 and Q10 form another strong CMOS inverter. FETs Q4 and Q9 form a weak CMOS inverter. FETs Q6 and Q7 serve as input elements that selectively receive data signal D0 or D1 under the control of selection signals S0 and S1. The CMOS inverter formed with FETs Q5 and Q10 provides output signal Q. Since strongest FET Q5 is part of inverter Q5 and Q10, it is the strongest inverter and therefore particularly suitable for driving output signal Q.

Lines 42 in FIG. 3 represent portions of the lower metal layer. Although illustrated as thick lines, lines 42 are considerably wider in fabricated function cell 40 than illustrated here. Inasmuch as the upper metal layer is typically not used in selectively interconnecting FETs within a function cell, electrical lines representing portions of the upper metal layer do not appear in FIG. 3.

In fabricated function cell 40, metal lines 42 are selectively connected to FETs Q3–Q10 through contact openings 43 (small squares) extending through the insulating material overlying the gate electrodes and source/drain regions. Inasmuch as metal lines 30 and 31 are part of the lower metal layer, contact openings 43 include contact openings through which lines 30 and 31 are connected to FETs Q3–Q5 and Q8–Q10. FIG. 3 illustrates the locations for two vias 44 by which certain of lower metal lines 42 are selectively connected to the upper metal layer. Although vias 44 are generally square in plan view, they are shown as small circles in FIG. 3 to help distinguish them from contact openings. The combination of lower metal lines 42, contact openings 43, and vias 44 forms the electrical interconnection network that converts basic cell 20 into function cell 40.

Basic cell 20 can be utilized to form a large number of SSI and MSI cells such as inverters, AND gates, OR gates, NAND gates, NOR gates, EXCLUSIVE OR gates, EXCLUSIVE NOR gates, multiplexers, flip-flops, and latches. FIGS. 4a–4f illustrates examples of the circuit diagrams for six typical function cells 50–55 created from basic cell 20 by establishing suitable electrical interconnection networks with the metal layers. Each inverter shown in FIGS. 4a–4f is a CMOS inverter formed with a P-channel insulated gate FET and an N-channel insulated-gate FET connected in series between the $V_{DD}$ and $V_{SS}$ voltage supplies. The inverter input signal is provided to the interconnected gate electrodes of the two FETs whose interconnected drains provide the inverter output signal.

Figure 4A:
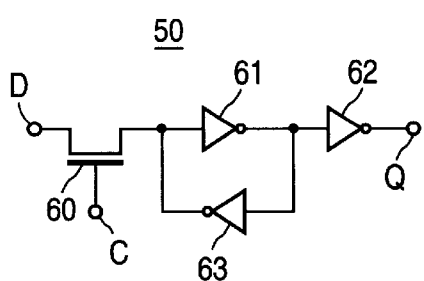
FIGS. 4a–4f are circuit diagrams of function cells that can be produced by selectively interconnecting transistors in one or more implementations of the basic cell of FIG. 2.

Function cell 50 in FIG. 4a is a latch consisting of a strong N-channel FET 60, strong inverters 61 and 62, and a weak inverter 63 created from one implementation of basic cell 20. Strong inverters 61 and 62 and strong FET 60 are typically formed with five of FETs Q1–Q3 and Q5–Q8 in basic cell 20. Weak inverter 63 is formed with FETs Q4 and Q9.

True data output signal Q is provided from latch 50 at the value of data input signal D loaded into cell 50 in response to control signal C. Although inverter 63 is a weak inverter, inverter 63 is strong enough to maintain the latched state in latch 50 when control signal C goes low. Because inverter 63 is a weak inverter, it can readily be overridden to allow the current value of data input signal D to be loaded into cell 50 when control signal C goes high. As a result, it is not necessary to place inverter 63 in series with a pass gate, typically a two-FET transmission gate, for overriding inverter 63. Latch 50 thus utilizes less transistors than would normally be needed to perform the same function in a latch laid out with a CMOS gate array.

Figure 4B:
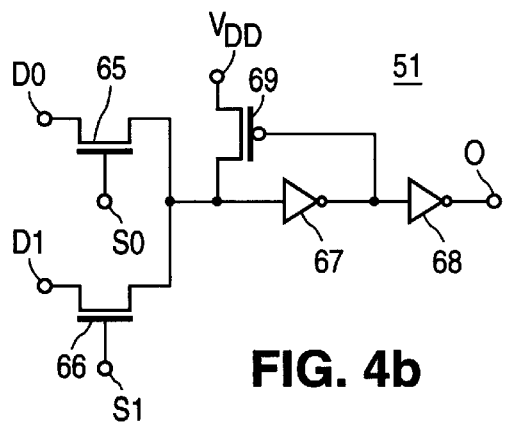

Function cell 51 in FIG. 4b is a two-input multiplexer formed with strong N-channel FETs 65 and 66, strong inverters 67 and 68, and a weak P-channel FET 69 created from one implementation of basic cell 20. Strong inverters 67 and 68 and strong FETs 65 and 66 are formed with six of FETs Q1–Q3, Q5–Q8, and Q10 in basic cell 20. Weak P-channel FET 69 is implemented with FET Q9.

Output signal O is provided from multiplexer 51 at the value of a selected one of input data signals D0 and D1 dependent on selection signals S0 and S1. P-channel FET 69, although a weak FET, is strong enough to pull the input of inverter 67 substantially up to high supply voltage $V_{DD}$ when the selected data input signal is high. Since FET 69 is a weak device, it can readily be overridden to allow the input of inverter 67 to go down substantially to low supply voltage $V_{SS}$ when the selected data input signal is low. Consequently, it is not necessary to place a pair of P-channel FETs respectively in series with N-channel input FETs 65 and 66 to form transmission gates for insuring proper cell operation when the selected data input signal is low. Multiplexer 51 therefore employs less transistors than an otherwise comparable multiplexer created from a CMOS gate array.

Figure 4C:
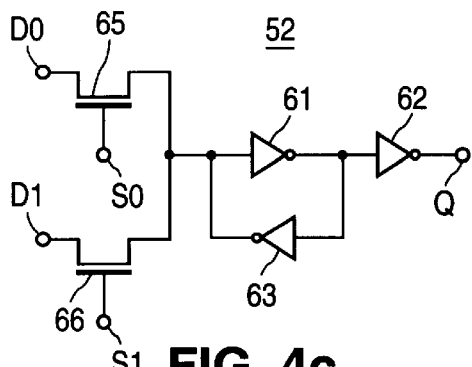

Function cell 52 in FIG. 4c basically combines multiplexer 51 and latch 50 to produce a two-input multiplexer-latch combination consisting of strong N-channel FETs 65 and 66, strong inverters 61 and 62, and weak inverter 63 created from one implementation of basic cell 20. Elements 65, 66, and 61–63 are typically formed with the FETs described above for function cells 50 and 51. An example of the FET selection for function cell 52 is shown in FIG. 3 where the layout of function cell 40 is an exemplary layout for multiplexer-latch combination 52.

When one of selection signals S0 and S1 to multiplexer-latch combination 52 is high while the other is low, the corresponding one of data input signals D0 and D1 is selected. The value of the selected data signal is latched into inverters 61 and 63 and supplied as true output signal Q. Weak inverter 63 is strong enough to perform the latching but weak enough to be readily overridden when the value of the selected data signal differs from the current value at the input of inverter 61. Weak inverter 63 also serves as a weak pull-up device that eliminates the need to provide a pair of P-channel FETs respectively in series with N-channel FETs 65 and 66 in order to obtain proper cell operation.

Multiplexer-latch combination 52 utilizes eight FETs compared to the fourteen FETs employed in functionally equivalent gate-latch combination 10 shown in FIG. 1. Implementing function cell 52 with basic cell 20 in accordance with the invention thus provides a large reduction in the number of transistors compared to the CMOS gate array equivalent shown in FIG. 1. The chip area is reduced in the invention, thereby enabling multiplexer-latch combination 52 to operate considerably faster than multiplexer-latch combination 10.

Figure 4D:
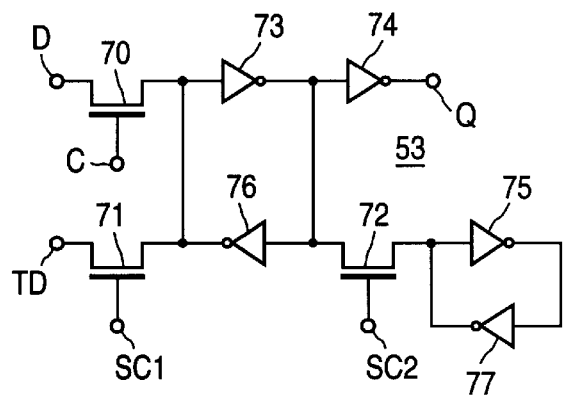

Function cell 53 in FIG. 4d is a scan latch consisting of strong N-channel FETs 70–72, strong inverters 73–75, and weak inverters 76 and 77 formed with two implementations of basic cell 20. The value of data signal D or test data signal TD is loaded into inverter pair 73 and 76, and can be transferred to inverter pair 75 and 77. True output signal Q is provided from scan latch 53 at the value of data signal D, test data signal TD, or the data stored in inverter pair 75 and 77 dependent on the values of control signals C and scan control signals SC1 and SC2. Inverters 76 and 77, as weak devices, enable scan latch 53 to be formed with at least eight fewer FETs than a functionally equivalent scan latch laid out with a CMOS gate array.

Figure 4E:
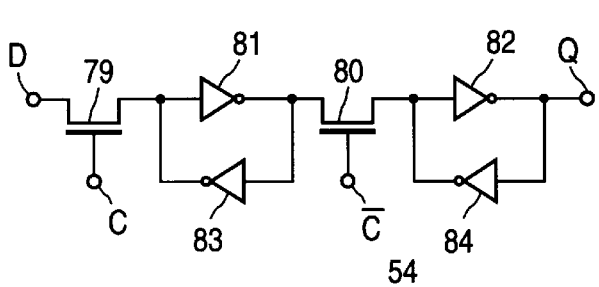

Function cell 54 in FIG. 4e is a D-type flip-flop consisting of strong N-channel FETs 79 and 80, strong inverters 81 and 82, and weak inverters 83 and 84 formed with two implementations of basic cell 20. The loading of data signal D into flip-flop 54 to produce true output signal Q is controlled by complementary control signals C and $\overline{C}$. Due to the usage of weak inverters 83 and 84, flip-flop 54 utilizes at least six fewer FETs than an otherwise equivalent flip-flop created from a CMOS gate array.

Figure 4F:
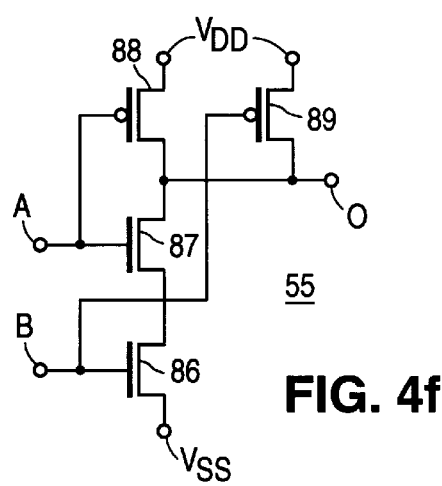

Function cell 55 in FIG. 4f is a NAND gate consisting of strong N-channel FETs 86 and 87 and strong P-channel FETs 88 and 89 created from one implementation of basic cell 20. Data output signal O is provided as the logical NAND of data input signals A and B. NAND gate 55 is a example of a function cell which, although created from basic cell 20, does not employ any weak FETs.

Figure 5A:
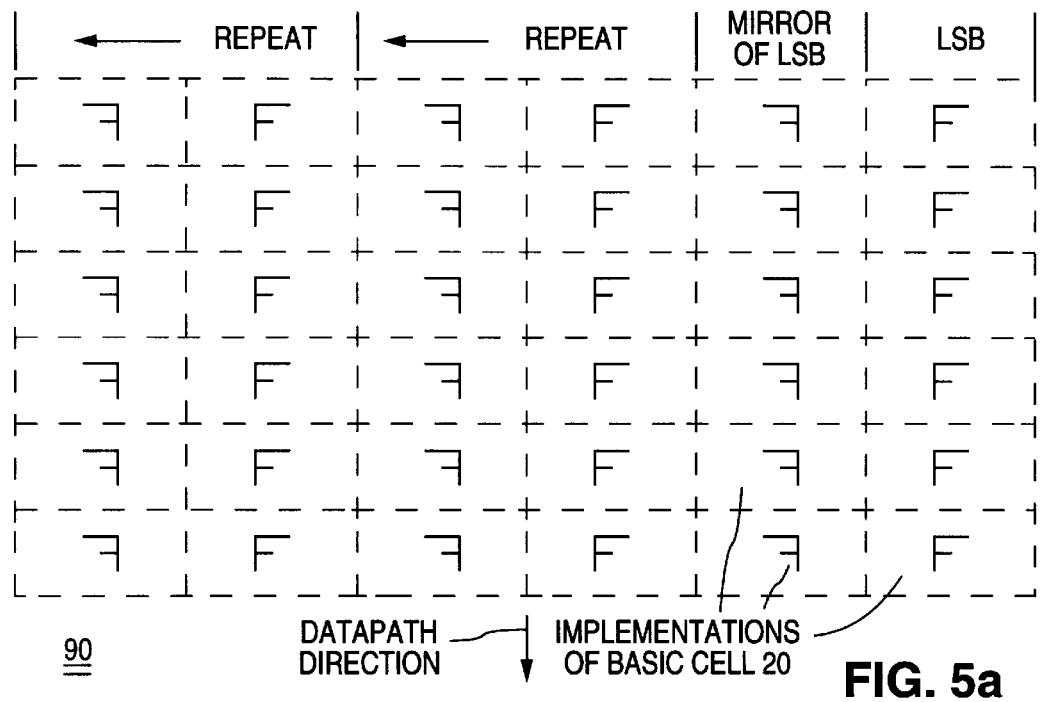
FIG. 5a is a plan view of a general layout for a group of basic cell implementations suitable for the datapath circuitry of an IC in accordance with the invention.

Basic cell 20 is especially useful in laying out datapath circuitry in an IC. FIG. 5a generally illustrates how a layout 90 for a multi-bit datapath is configured in an array of rows and columns of implementations of basic cell 20. Each dotted rectangle in FIG. 5a is one of the basic cell implementations.

The character within each dotted rectangle in FIG. 5a indicates the orientation of that implementation of basic cell 20. The "F" character means that a basic cell implementation is laid out in one orientation, for example, as shown for basic cell 20 in FIG. 2. The reverse "F" character means that a basic cell implementation is laid out in a mirror image of the "F" layout. The vertical arrow in FIG. 5a indicates the physical direction in which data is processed along the datapath.

Each column in layout 90 is a bitslice of the datapath. The right-most column is a bitslice for the least significant bit ("LSB"). All the implementations of basic cell 20 in any particular bitslice have the same orientation. The orientation of the basic cell implementations in one bitslice is the opposite of the orientation of the basic cell implementations in each directly adjoining bitslice as shown in FIG. 5a.

Basic cell 20 can be created in mirror images for generating function cells in mirror images. However, the function cells in each bitslice often perform exactly the same functions as the function cells in each directly adjoining bitslice. In this case, it is simpler to reverse the layout pattern for the LSB bitslice in order to generate the layout pattern for the bitslice of the next higher bit. The layout patterns of the bitslices for the LSB and the next higher bit are then repeated for each additional pair of bitslices.

Datapath layout 90 is created by selecting appropriate functions cells from the function cell library, normally maintained in a suitable software database, and then entering implementations of the selected function cells into desired locations in layout 90. If layout 90 requires any function cells not already in the library, these function cells can be appropriately created from basic cell 20 and entered into the library. The electrical interconnections between function cells are established during the layout process.

Figure 5B:
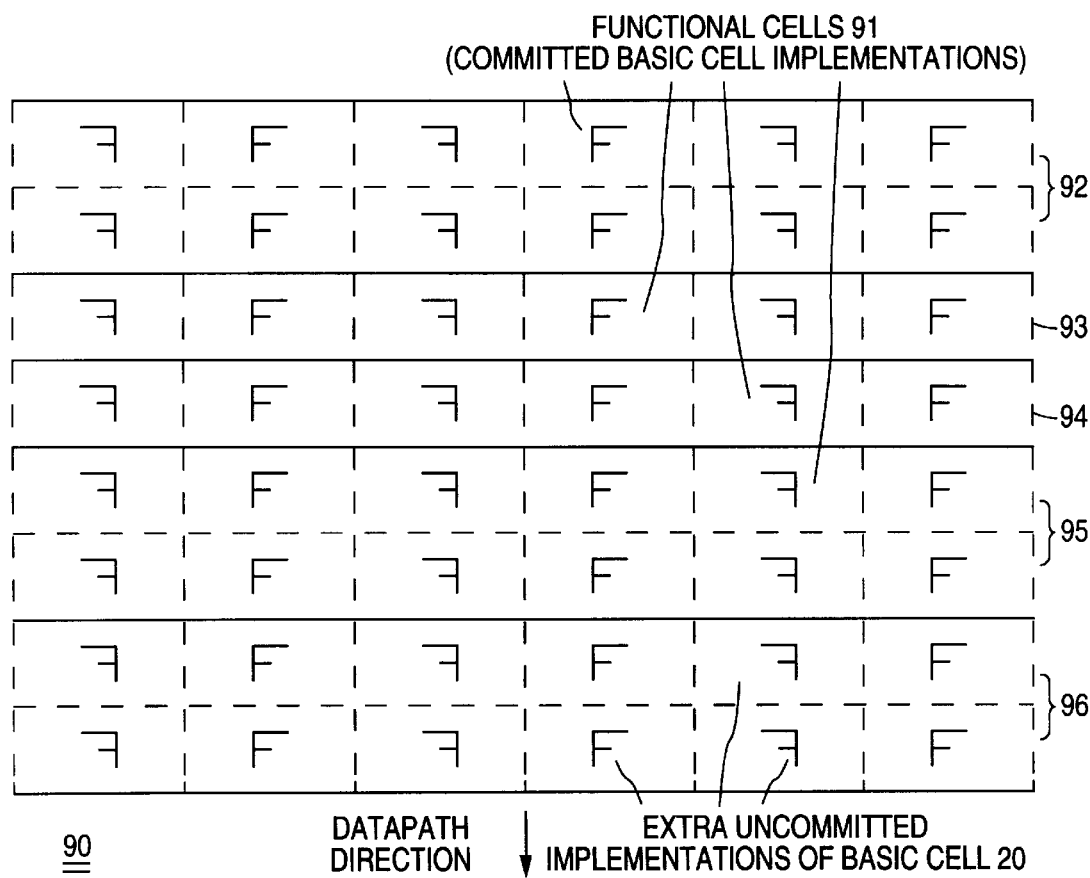
FIG. 5b is a plan view of a general layout of function cells that implement datapath circuitry in accordance with the invention.

FIG. 5b illustrates how datapath layout 90 appears when the basic cell implementations are allocated into function cell implementations 91. Layout 90 in FIG. 5b contains four rows 92–95 of implemented function cells 91. Each implemented function cell 91 in row 92 or 95 employs two implementations of basic cell 20. Each implemented function cell 91 in row 93 or 94 employs one implementation of basic cell 20.

In addition to rows 92–95, two rows 96 of uncommitted (unconnected) implementations of basic cell 20 are provided at the end of datapath layout 90 in FIG. 5b. Uncommitted basic cell implementations are utilized for correcting errors found in the datapath design. For example, if it is discovered that each implemented function cell 91 in row 94 needs to be replaced with a function cell that employs two implementations of basic cell 20, row 95 can be shifted down one row to occupy one of rows 96. The replacements for implemented function cells 91 in row 94 are then inserted in the place occupied by row 94 and by the original top half of row 95. Although the location of row 95 is shifted, the interconnections of implemented function cells 91 in row 95 are unchanged. The usage of extra rows 96 of uncommitted basic cell implementations thus facilitates correcting circuit design errors.

Depending on how many FETs in an implemented function cell are actually utilized to perform the cell function, a design error can sometimes be corrected directly in a function cell. Consider an example in which implemented function cells 91 in row 93 each consist of NAND gate 55 in FIG. 4f. NAND gate 55 utilizes only four of the ten FETs available in basic cell 20. If it were discovered that one of data input signals A and B needed to be inverted or NANDed for proper datapath operation, an inverter or a NAND gate could be created from the six unconnected FETs in each of implemented function cells 91 in row 93 and placed before the input that needs to be inverted or NANDed. The availability of unconnected transistors in implemented function cells 91 of rows 92–95 also facilitates correcting circuit design errors.

After datapath layout 90 is completed, appropriate masks that bear the features of layout 90 are produced. The masks are utilized in fabricating the desired IC from a semiconductor wafer according to a suitable manufacturing process. The interconnection networks established in function cells 91 are incorporated into an electrical interconnection system that overlies the semiconductor wafer, including the implementations of basic cell 20. Also, the electrical interconnections established between function cells 91 are incorporated into the interconnection system. This largely completes the basic die fabrication.

While the invention has been described with reference to particular embodiments, this description is solely for the purpose of illustration and is not to be construed as limiting the scope of the invention claimed below. For example, basic cell 20 can be formed with junction FETs instead of, or in combination with, insulated-gate FETs. Similarly, complementary bipolar transistors can be utilized in place of, or in combination with, FETs in basic cell 20. Transistors of only one polarity type (e.g., N-channel or/and NPN) can be employed in cell 20.

In addition to transistors, basic cell 20 can have other types of circuit elements such as resistors, capacitors, and diodes. A circuit can be laid out using two or more different basic cells, each having circuit elements, including transistors, suitable to form at least one strong inverter and at least one weak inverter. Normally, each of the different basic cells would have circuit elements, including transistors, suitable for creating multiple strong inverters, a different number of which are typically available in each different basic cell.

The interconnect functions of the metal layers can be altered. As one example, the upper metal layer can be employed to selectively interconnect the transistors and, if present, other circuit elements in each function cell, while the lower metal layer is utilized to selectively interconnect, and provide control signals to, the function cell implementations. Alternatively, each metal layer could perform at least two of the three functions of interconnecting transistors in a function cell, interconnecting function cell implementations, and carrying control signals to function cell implementations.

Three or more metal layers can be employed in the electrical interconnection system of an IC laid out according to the invention. In an IC having datapath circuitry, the highest of three metal layers would typically be used for carrying bus signals that feed through multiple function cell implementations in each bitslice.

The bulk of the wafer can be a lightly doped N-type substrate rather than a lightly doped P-type substrate. The N− substrate could then replace N− well 23 in a single-well process. Alternatively, N− well 23 and P− material 24 could be formed in a lightly doped epitaxial layer grown over a more heavily doped substrate. The polysilicon gate electrodes in basic cell 20 can be of the same conductivity type for both the N-channel and P-channel insulated-gate FETs. Various modifications and applications may thus be made by those skilled in the art without departing from the true scope and spirit of the invention as described in the appended claims.

We claim:

1. A library of function cells for designing a layout for at least part of an integrated circuit, each function cell comprising at least one implementation of a basic cell formable from semiconductor material, each basic cell implementation comprising a plurality of unconnected transistors configured in a transistor pattern largely identical to, or largely a mirror image of, the transistor pattern in each other basic cell implementation, transistors of a given polarity type in each basic cell implementation being of at least two different current-carrying capabilities of which one of the current-carrying capabilities is at least 10 times another of the current-carrying capabilities, each function cell also having an electrical interconnection network for electrically interconnecting the transistors of that function cell in a physical pattern different from the transistors in each other function cell such that each function cell, except a substantial mirror image of that function cell, performs a different electronic function.

2. A library as in claim 1 wherein transistors of a specified polarity type in each basic cell implementation are of a first current-carrying capability and a second current-carrying capability less than the first current-carrying capability, more of the transistors in each basic cell implementation being of at least the first current-carrying capability than the second current-carrying capability.

3. A library as in claim 2 wherein the first current-carrying capability is at least 30 times the second current-carrying capability.

4. A library as in claim 1 wherein the transistors comprise insulated-gate field-effect transistors ("FETs").

5. A library as in claim 4 wherein the transistors in each basic cell implementation comprise:
   a plural number of N-channel FETs of at least a first current-carrying capability;
   an N-channel FET of a second current-carrying capability less than the first current-carrying capability;
   a plural number of P-channel FETs of at least a third current-carrying capability; and
   a P-channel FET of a fourth current-carrying capability less than the third current-carrying capability.

6. A library as in claim 5 wherein:
   the first current-carrying capability is at least 40 times the second current-carrying capability; and
   the third current-carrying capability is at least 30 times the fourth current-carrying capability.

7. A library as in claim 1 wherein, for transistors of a given polarity type in each basic cell implementation, one of their current-carrying capabilities is at least 30 times another of their current-carrying capabilities.

8. A method comprising the steps of:
   establishing a library of function cells, each comprising at least one implementation of a basic cell formable from semiconductor material, each basic cell implementation comprising a plurality of unconnected transistors configured in a transistor pattern largely identical to, or largely a mirror image of, the transistor pattern in each other basic cell implementation, transistors of a given polarity type in each basic cell implementation being of at least two different current-carrying capabilities of which one of the current-carrying capabilities is at least 10 times another of the current-carrying capabilities, each function cell also having an electrical interconnection network for electrically interconnecting the transistors of that function cell in a physical pattern different from the transistors in each other function cell such that each function cell, except substantially a mirror image of that function cell, performs a different electronic function;
   selecting certain of the function cells from the library; and
   organizing at least one implementation of each selected function cell into a layout for at least part of an integrated circuit that performs a specified electronic circuit function.

9. A method as in claim 8 further including the step of fabricating the integrated circuit from a semiconductor body according to the layout such that the function cell implementations are incorporated at least partly into the semiconductor body and such that the interconnection networks of the function cell implementations are incorporated into an electrical interconnection system that overlies and interconnects the basic cell implementations.

10. A method as in claim 8 wherein transistors of a specified polarity type in each basic cell implementation are of a first current-carrying capability and a second current-carrying capability less than the first current-carrying capability, more of the transistors in each basic cell implementation being of at least the first current-carrying capability than the second current-carrying capability.

11. A method as in claim 10 wherein the first current-carrying capability is at least 30 times the second current-carrying capability.

12. A method as in claim 8 wherein the organizing step further entails providing the transistors as insulated-gate field-effect transistors ("FETs").

13. A method as in claim 12 wherein the transistors in each basic cell implementation comprise:
   a plural number of N-channel FETs of at least a first current-carrying capability;
   an N-channel FET of a second current-carrying capability less than the first current-carrying capability;
   a plural number of P-channel FETs of at least a third current-carrying capability; and
   a P-channel FET of a fourth current-carrying capability less than the third current-carrying capability.

14. A method as in claim 13 wherein:
   the first current-carrying capability is at least 40 times the second current-carrying capability; and
   the third current-carrying capability is at least 30 times the fourth current-carrying capability.

15. A method as in claim 8 wherein the organizing step entails:
   providing the layout with further implementations of the basic cell such that the further basic cell implementations are largely identical to the first-mentioned basic cell implementations but are not initially allocated into any of the function cell implementations; and
   establishing electrical interconnections (a) for selectively interconnecting transistors in the further basic cell implementations to enable them to perform at least one desired electronic function and (b) for selectively electrically interconnecting the further and first-mentioned basic cell implementations.

16. A method as in claim 15 wherein the providing and establishing steps of the organizing step are performed to make at least one circuit design revision in an initial version of the layout.

17. A method as in claim 8 wherein the organizing step entails:
   examining the function cell implementations to identify any of their transistors not utilized in performing electronic circuit functions; and
   establishing electrical interconnections for selectively interconnecting any so-identified transistors to perform at least one desired electronic function.

18. A method as in claim 17 wherein the examining and establishing steps of the organizing step are performed to make at least one circuit design revision in an initial version of the layout.

19. A method as in claim 8 wherein, for transistors of a given polarity type in each basic cell implementation, one of their current-carrying capabilities is at least 30 times another of their current-carrying capabilities.

20. A method comprising the steps of:
   providing a library of function cells, each comprising at least one implementation of a basic cell formable from semiconductor material, each basic cell implementation comprising a plurality of unconnected transistors configured in a transistor pattern largely identical to, or largely a mirror image of, the transistor pattern in each other basic cell implementation, each function cell also having an electrical interconnection network for electrically interconnecting the transistors of that function cell in a physical pattern different from the transistors in each other function cell such that each function cell, except substantially a mirror image of that function cell, performs a different electronic function;

selecting certain of the function cells from the library; and organizing at least one implementation of each selected function cell into a layout for a multi-bit datapath of an integrated circuit that performs a specified electronic circuit function such that data is processed along the datapath in largely a single physical direction.

21. A method as in claim 20 further including the step of fabricating the integrated circuit from a semiconductor body according to the layout such that the function cell implementations are incorporated at least partly into the semiconductor body and such that the interconnection networks of the function cell implementations are incorporated into an electrical interconnection system that overlies and interconnects the basic cell implementations.

22. A method as in claim 20 wherein the organizing step entails configuring the datapath in an array of rows and columns of the basic cell implementations.

23. A method as in claim 22 wherein each column comprises a bitslice of the datapath and is largely repeatable in each other bitslice.

24. A method as in claim 20 wherein the organizing step entails:

providing the layout with further implementations of the basic cell such that the further basic cell implementations are largely identical to the first-mentioned basic cell implementations but are not initially allocated into any of the function cell implementations; and establishing electrical interconnections (a) for selectively interconnecting transistors in the further basic cell implementations to enable them to perform at least one desired electronic function and (b) for selectively electrically interconnecting the further and first-mentioned basic cell implementations.

25. A method as in claim 24 wherein the providing and establishing steps of the organizing step are performed to make at least one datapath design revision in an initial version of the layout.

26. A method as in claim 20 wherein the organizing step entails:

examining the function cell implementations to identify any of their transistors not utilized in performing electronic circuit functions; and establishing electrical interconnections for selectively interconnecting any so-identified transistors to perform at least one desired electronic function.

27. A method as in claim 26 wherein the examining and establishing steps of the organizing step are performed to make at least one datapath design revision in an initial version of the layout.

28. A method as in claim 20 wherein transistors of a given polarity type in each basic cell implementation are of at least two different current-carrying capabilities.

29. A method as in claim 28 wherein, for transistors of a given polarity type in each basic cell implementation, one of their current-carrying capabilities is at least 10 times another of their current-carrying capabilities.

30. A method as in claim 29 wherein transistors of a specified polarity type in each basic cell implementation are of a first current-carrying capability and a second current-carrying capability less than the first current-carrying capability, more of the transistors in each basic cell implementation being of at least the first current-carrying capability than the second current-carrying capability.

31. A method as in claim 30 wherein the first current-carrying capability is at least 30 times the second current-carrying capability.

32. A method as in claim 29 wherein the transistors comprise insulated-gate field-effect transistors ("FETs").

33. A method as in claim 32 wherein the transistors in each basic cell implementation comprise:

a plural number of N-channel FETs of at least a first current-carrying capability;

an N-channel FET of a second current-carrying capability less than the first current-carrying capability;

a plural number of P-channel FETs of at least a third current-carrying capability; and a P-channel FET of a fourth current-carrying capability less than the third current-carrying capability.

34. A method as in claim 33 wherein:

the first current-carrying capability is at least 40 times the second current-carrying capability; and the third current-carrying capability is at least 30 times the fourth current-carrying capability.

35. A method as in claim 29 wherein, for transistors of a given polarity type in each basic cell implementation, one of their current-carrying capabilities is at least 30 times another of their current-carrying capabilities.

36. A method as in claim 29 wherein the organizing step entails:

providing the layout with further implementations of the basic cell such that the further basic cell implementations are largely identical to the first-mentioned basic cell implementations but are not initially allocated into any of the function cell implementations; and establishing electrical interconnections (a) for selectively interconnecting transistors in the further basic cell implementations to enable them to perform at least one desired electronic function and (b) for selectively electrically interconnecting the further and first-mentioned basic cell implementations.

37. A semiconductor structure comprising a multiplicity of function cells formed from a semiconductor body having an upper surface, each function cell comprising at least one implementation of a basic cell, each basic cell implementation comprising a plurality of unconnected transistors laid out along the upper surface in a transistor pattern largely identical to, or largely a mirror image of, the transistor pattern in each other basic cell implementation, transistors of a given polarity type in each basic cell implementation being of at least two different current-carrying capabilities of which one of the current-carrying capabilities is at least 10 times another of the current-carrying capabilities, the transistors being selectively interconnected through an electrical interconnection system overlying the basic cell implementations to enable the semiconductor structure to perform a specified electronic function, the transistors in at least one function cell being interconnected through the interconnection system in a different arrangement from the transistors in at least one other function cell.

38. A structure as in claim 37 wherein transistors of a specified polarity type in each basic cell implementation are of a first current-carrying capability and a second current-carrying capability less than the first current-carrying capability, more of the transistors in each basic cell implementation being of at least the first current-carrying capability than the second current-carrying capability.

39. A structure as in claim 38 wherein the first current-carrying capability is at least 30 times the second current-carrying capability.

40. A structure as in claim 37 wherein the transistors comprise insulated-gate field-effect transistors ("FETs") having source/drain regions situated in the semiconductor body and having electrically insulated gate electrodes overlying the semiconductor body.

41. A structure as in claim 40 wherein the transistors in each basic cell implementation comprise:
   a plural number of N-channel FETs of at least a first current-carrying capability;
   an N-channel FET of a second current-carrying capability less than the first current-carrying capability;
   a plural number of P-channel FETs of at least a third current-carrying capability; and
   a P-channel FET of a fourth current-carrying capability less than the third current-carrying capability.

42. A structure as in claim 41 wherein:
   the first current-carrying capability is at least 40 times the second current-carrying capability; and
   the third current-carrying capability is at least 30 times the fourth current-carrying capability.

43. A structure as in claim 37 wherein, for transistors of a given polarity type in each basic cell implementation, one of their current-carrying capabilities is at least 30 times another of their current-carrying capabilities.

44. A structure comprising a multiplicity of function cells formed from a semiconductor body having an upper surface, each function cell comprising at least one implementation of a basic cell, each basic cell implementation comprising a plurality of unconnected transistors laid out along the upper surface in a transistor pattern largely identical to, or largely a mirror image of, the transistor pattern in each other basic cell implementation, the basic cell implementations being arranged in a multi-bit datapath in which data is processed along the datapath in largely a single physical direction, the transistors being selectively interconnected through an electrical interconnection system overlying the basic cell implementations to enable the semiconductor structure to perform a specified electronic function, the transistors in at least one function cell being interconnected through the interconnection system in a different arrangement from the transistors in at least one other function cell.

45. A structure as in claim 44 wherein transistors of a given polarity type in each basic cell implementation are of at least two different current-carrying capabilities.

46. A method as in claim 45 wherein the transistors comprise insulated-gate field-effect transistors ("FETs").

47. A method as in claim 46 wherein the transistors in each basic cell implementation comprise:
   a plural number of N-channel FETs of at least a first current-carrying capability;
   an N-channel FET of a second current-carrying capability less than the first current-carrying capability;
   a plural number of P-channel FETs of at least a third current-carrying capability; and
   a P-channel FET of a fourth current-carrying capability less than the third current-carrying capability.

48. A structure as in claim 47 wherein:
   the first current-carrying capability is at least 40 times the second current-carrying capability; and
   the third current-carrying capability is at least 30 times the fourth current-carrying capability.

49. A structure as in claim 45 wherein, for transistors of a given polarity type in each basic cell implementation, one of their current-carrying capabilities is at least 10 times another of their current-carrying capabilities.

50. A structure as in claim 49 wherein, for transistors of a given polarity type in each basic cell implementation, one of their current-carrying capabilities is at least 30 times another of their current-carrying capabilities.

51. A structure as in claim 49 wherein transistors of a specified polarity type in each basic cell implementation are of a first current-carrying capability and a second current-carrying capability less than the first current-carrying capability, more of the transistors in each basic cell implementation being of at least the first current-carrying capability than the second current-carrying capability.

52. A structure as in claim 51 wherein the first current-carrying capability is at least 30 times the second current-carrying capability.

53. A method as in claim 44 wherein the datapath comprises an array of rows and columns of the basic cell implementations.

54. A structure as in claim 53 wherein each column comprises a bitslice of the datapath and is largely repeatable in each other bitslice.

55. A method comprising the steps of:
   establishing a library of function cells, each comprising at least one implementation of a basic cell formable from semiconductor material, each basic cell implementation comprising a plurality of unconnected transistors configured in a transistor pattern largely identical to, or largely a mirror image of, the transistor pattern in each other basic cell implementation, transistors of a given polarity type in each basic cell implementation being of at least two different current-carrying capabilities, each function cell also having an electrical interconnection network for electrically interconnecting the transistors of that function cell in a physical pattern different from the transistors in each other function cell such that each function cell, except substantially a mirror image of that function cell, performs a different electronic function;
   selecting certain of the function cells from the library; and
   organizing at least one implementation of each selected function cell into a layout for at least part of an integrated circuit that performs a specified electronic circuit function, the organizing step including:
      providing the layout with further implementations of the basic cell such that the further basic cell implementations are largely identical to the first-mentioned basic cell implementations but are not initially allocated into any of the function cell implementations; and
      establishing electrical interconnections (a) for selectively interconnecting transistors in the further basic cell implementations to enable them to perform at least one desired electronic function and (b) for selectively electrically interconnecting the further and first-mentioned basic cell implementations.

56. A method as in claim 55 wherein the providing and establishing steps of the organizing step are performed to make at least one circuit design revision in an initial version of the layout.

* * * * *